(12) United States Patent
Petri et al.

(10) Patent No.: US 10,291,784 B2
(45) Date of Patent: May 14, 2019

(54) ADAPTIVE FILTER UNIT FOR BEING USED AS AN ECHO CANCELLER

(71) Applicant: Sennheiser Communications A/S, Ballerup (DK)

(72) Inventors: Stig Petri, Ballerup (DK); Svend Feldt, Ballerup (DK)

(73) Assignee: SENNHEISER COMMUNICATIONS A/S, Ballerup (DK)

( * ) Notice: Subject to any disclaimer, the term of this patent is extended or adjusted under 35 U.S.C. 154(b) by 42 days.

(21) Appl. No.: 15/655,295

(22) Filed: Jul. 20, 2017

(65) Prior Publication Data

US 2018/0027125 A1 Jan. 25, 2018

(30) Foreign Application Priority Data

Jul. 20, 2016 (EP) .................................... 16180326

(51) Int. Cl.
*H04M 9/08* (2006.01)
*G06F 17/14* (2006.01)
(Continued)

(52) U.S. Cl.
CPC .......... *H04M 9/082* (2013.01); *G06F 17/142* (2013.01); *G10L 21/0208* (2013.01);
(Continued)

(58) Field of Classification Search
CPC .................................................. H04M 9/082
(Continued)

(56) References Cited

U.S. PATENT DOCUMENTS 9,749,741 B1 * 8/2017 Yang ...................... H04R 3/007
2008/0312916 A1 * 12/2008 Konchitsky ......... G10L 21/0208
704/226

(Continued)

FOREIGN PATENT DOCUMENTS

EP 2 221 983 A1 8/2010
JP 2015-37239 A 2/2015

OTHER PUBLICATIONS

Avendano, Carlos "Acoustic Echo Suppression in the STFT Domain" Applications of Signal Processing to Audio and Acoustics, IEEE, Oct. 21-24, 2001, pp. 175-178.

*Primary Examiner* — Md S Elahee
(74) *Attorney, Agent, or Firm* — Birch, Stewart, Kolasch & Birch, LLP

(57) ABSTRACT

The invention relates to an adaptive filter unit, in particular for being used as an echo canceller, comprising a first filter input, configured to receive a first electric audio signal, indicative of a first audio signal A(t), a second filter input, configured to receive a second electric audio signal, indicative of a second audio signal B(t), a processor and a filter output. The processor is configured to calculate and provide audio estimation data $X(f_n, A(t_1, \ldots, t_{M(fn)}))$ in the frequency domain; to calculate a transformed second audio signal $Y(f_n, B(t))$, formed by a transformation of the second audio signal B(t) into the frequency domain; and to calculate a filtered audio signal by subtracting delayed audio estimation data from the transformed second audio signal, wherein the delayed audio estimation data is provided by a memory unit of the adaptive filter unit, which is arranged to provide a data exchange with the processor, and wherein the delayed audio estimation data comprises a frequency dependent time delay compared to the transformed second audio signal.

20 Claims, 4 Drawing Sheets

(51) Int. Cl.
*H03H 21/00* (2006.01)
*H04B 3/23* (2006.01)
*H04R 3/02* (2006.01)
*G10L 21/0208* (2013.01)
*G10L 21/0232* (2013.01)

(52) U.S. Cl.
CPC ..... *G10L 21/0232* (2013.01); *H03H 21/0027* (2013.01); *H04B 3/23* (2013.01); *H04R 3/02* (2013.01); *G10L 2021/02082* (2013.01)

(58) Field of Classification Search
USPC ............ 381/71.1, 94.2; 379/406.08; 704/226
See application file for complete search history.

(56) References Cited

U.S. PATENT DOCUMENTS

2010/0158269 A1* 6/2010 Zhang ................ G10L 21/0208
381/94.2
2013/0251169 A1  9/2013 Awano et al.

\* cited by examiner

ADAPTIVE FILTER UNIT FOR BEING USED AS AN ECHO CANCELLER

TECHNICAL FIELD

The invention relates to an adaptive filter unit, in particular for being used as an echo canceller. Furthermore, the invention relates to a hearing device, to a method for performing echo cancelling and to a computer program for controlling an operation of an adaptive filter unit.

BACKGROUND

In recently developed mobile audio devices, acoustic coupling between speaker and microphone during mobile telephony leads to a decreasing quality of respective audio outputs. Therefore, echo canceller applications have been developed. Such echo canceller applications are usually formed as filter units and configured to avoid an acoustic output signal of the mobile audio device to be transmitted back via the microphone to an external device that is connected with the mobile audio device. Particularly important are echo cancelation applications for closed rooms, which have the tendency to support long echoes.

Document US 2013/251169 A describes an echo canceller that includes a signal-to-echo ratio calculating unit and a residual echo suppressing unit. The signal-to-echo calculating unit computes a signal-to-echo ratio SE(n) indicating a ratio of an echo component to a received signal x(n) from a first residual signal and a second residual signal. The first residual signal is obtained using a filter coefficient sequence of an update filter, which is obtained up to the previous operation. The second residual signal is obtained using an updated filter coefficient sequence that undergoes a coefficient update which is performed, using an arbitrary update step size $\mu(n)$, on the filter coefficient sequence of the update filter, which is obtained up to the previous operation. The residual echo suppressing unit suppresses the echo component contained in the microphone input signal in accordance with the signal-to-echo ratio the signal-to-echo ratio calculating unit computes.

It is the object of the present invention to provide an improved adaptive filter unit for being used as an echo canceller.

SUMMARY

According to a first aspect, the invention relates to an adaptive filter unit, in particular for being used as an echo canceller. The adaptive filter unit comprises a first filter input, a second filter input, a processor and a filter output.

The processor may be arranged and configured to
  receive the first and second electric audio signal;
  calculate and provide audio estimation data $X(f_n, A(t_1, \ldots, t_{M(fn)}))$ in the frequency domain by calculating a FFT transform of the first audio signal A(t), for frequencies $f_n = f_1, \ldots, f_N$, wherein N is a number of FFT bins, and with a number of sampling points $M(f_n)$ of the first audio signal A(t);
  calculate a transformed second audio signal $Y(f_n, B(t))$, formed by a transformation of the second audio signal B(t) into the frequency domain;
  calculate a filtered audio signal by subtracting delayed audio estimation data from the transformed second audio signal, wherein the delayed audio estimation data may be provided by a memory unit of the adaptive filter unit, which is arranged to provide a data exchange with the processor, and wherein the delayed audio estimation data comprises a frequency dependent time delay compared to the transformed second audio signal; and
  calculate a processed audio output signal by transforming the filtered audio signal into the time domain.

The filter output may be configured to provide the processed audio output signal.

The first filter input may be configured to receive a first electric audio signal, indicative of a first audio signal A(t).

The second filter input may be configured to receive a second electric audio signal, indicative of a second audio signal B(t).

The first filter input and the second filter input may be a filter bank analysis including time to frequency conversion of the first electric audio signal and the second electric audio signal, respectively.

A filter bank analysis may be an array of filters, such as a bandpass filters, that decompose the electric audio signals into multiple components, each component carrying a single frequency sub-band of the original electric audio signal. The output of analysis may be referred to as a subband signal with as many subbands as there are filters in the filter bank.

The filter output may be a filter bank synthesis including frequency to time conversion of the processed audio output signal.

Another application of filter banks may be signal compression, when some frequencies are more important than others. After decomposition, the important frequencies can be coded with a fine resolution. Small differences at these frequencies are significant and a coding scheme that preserves these differences must be used. On the other hand, less important frequencies do not have to be exact. A coarser coding scheme can be used, even though some of the finer (but less important) details will be lost in the coding.

An advantage of the adaptive filter unit is that the time delay is frequency dependent, which allows signal processing resources like a memory of the echo canceller to be used in the most important parts of the frequency spectrum. For instance, the adaptive filter unit could allow a large time delay, i.e. long filters, for low frequencies, where rooms have the tendency to have the longest echoes. Thus, the adaptive filter unit according to the first aspect of the invention allows large time delays for critical frequencies to achieve a good filtering performance and short time delays for other frequencies to maintain a best use of available processing resources.

Different frequency dependencies of the time delay might be used within the adaptive filter unit. Thereby, the adaptive filter unit can be adapted to different applications for a large variety of hearing devices, such as headsets, headphones and hearing aids. The use in hearing aids is particularly advantageous, since the frequency dependent time delay can be adapted with respect to the hearing capability of a user of the hearing aid.

Using first and second filter inputs and a filter output is rather usual in the field of echo cancellation. Therefore, the adaptive filter unit can be advantageously integrated in well known hearing devices by simply exchanging a prior art adaptive filter previously used in the hearing device.

The used Fast Fourier Transform (FFT) provides a well known, simple and fast algorithm to transform the time dependent audio signals A(t) and B(t) into the frequency domain. It is furthermore well known that the sampling points of a signal to be transformed are formed by a number of data points of the signal received at respective discrete time points of the signal. These sampling points are than used to calculate a data point for a single one of the FFT bins in the frequency domain via the FFT. By repeating the transformation to discrete FFT bins for the same or different sampling points of time dependent in data, FFT transformed data in the frequency domain is provided.

The data exchange between the processor and the memory unit does at least provide the audio estimation data to the memory unit and the delayed audio estimation data from the memory unit back to the processor. The delayed audio estimation data is thereby formed by audio estimation data that is stored in the memory unit and therefore delayed compared to more recent audio signals received by the adaptive filter unit.

The memory unit and the processor may be formed as separated units of the adaptive filter unit, and may be integrated into a common unit.

The adaptive filter unit according the first aspect of the invention will be described.

The processor of the adaptive filter unit comprises a multidelay filter structure. The multidelay filter structure provides a block-based frequency domain implementation of the well known least mean square filter algorithm. This structure partitions a long filter into many subfilters so that the FFT transforms less data in parallel steps, which reduces memory requirements and a time delay caused by the processing of the processor. A detailed description of the well known multidelay filter structure is given in J.-S. Soo, K. Pang "Multidelay block frequency domain adaptive filter" (IEEE Transactions on Acoustics, Speech and Signal Processing, vol. 38, no. 2, pp. 373-376, 1990).

The memory unit comprises a delay line structure comprising at least one delay line, which contains at least the audio estimation data $X(f_n, A('t_1, \ldots, t'_{M(fn)}))$ for points in time $t'_1, \ldots, t_{M(fn)}'$ being before the time $t_1$. The memory unit stores audio estimation data that has been obtained in the past and thus comprises a time delay with respect to the time $t_1$ of a data point of the most recent audio signal. Thus, the memory unit provides a simple structure that allows a storing of data with a respective time delay.

The memory unit comprises a plurality of circular delay lines allocated to each frequency $f_n$, respectively, wherein the circular delay lines vary in line length, which is defined as a maximum number of values that can be stored in the respective circular delay line. The circular delay lines advantageously allow a respective delay line for each FFT bin and therefore a line length that may be adapted to the frequency dependent time delay. Since the position of a value in the circular delay line depends on the time delay of the corresponding signal with respect to the most recent signal, the delay of the value can be computed very efficiently by the processor or by the memory unit. A varying line length of the circular delay lines is particularly advantageous for an adaptive filter unit that comprises a fixed frequency dependent time delay, since the delay line structure does not need to be adapted to different frequency dependencies in this case. In circular delay lines, old values are simply overwritten by new values after a predefined time period, which depends on the line length, so that the circular delay lines furthermore avoid the single processing step of deleting values in the delay lines.

The data exchange between the processor and the memory unit comprises an allocation of a value of the audio estimation data $X(f_n, A(t_1, \ldots t_{M(fn)}))$ for each frequency $f_n$ to a memory address of a memory structure of the memory unit. In a variant, an allocation information indicative of the respective allocation is received by the processor. The exchange of the allocation of a value can lead to a simple and fast access of the processor to delayed data with a well defined time delay. Preferably, the allocation information further comprises a signal time indicative of the time at which the value of the audio estimation data has been allocated to the memory address.

Each delay line comprises a line length that may be limited to powers of two. In view of the usual binary structure of the memory address, the line length avoids a wasting of memory.

The memory unit comprises a base address register allocating each circular delay line to a base address, and further comprises at least one bookkeeping buffer, configured to store the line length and the base address of each circular delay line. Preferably, separate bookkeeping buffers may be used for storing the line length and the base address of each circular delay line. The use of base address register in general is well known and easy to integrate in modern signal processing systems. By storing the base address, the bookkeeping buffers allow a placing of the circular delay lines at any memory address. Thus, the bookkeeping buffers lead to a very efficient usage of the memory and further helps to provide the best possible use of available resources. The bookkeeping buffers further remove the need for placing the delay lines at certain places in memory. In a variant, the bookkeeping buffer may be used to allow a placing of all delay lines in a block of memory within the memory unit. In a preferred example of this variant, the block of memory has a block size that equals a sum of all line lengths of the circular delay lines. This block of memory is particularly advantageous, since it is possible to store all values, which are stored in the circular delay lines, in the block of memory and vice versa.

In the adaptive filter unit, the number $M(f_n)$ of sampling points of the first audio signal is equal for all FFT bins. Thus, the calculations of the processor with respect to the FFT are equal for all FFT bins. This helps to provide equal calculation times for all FFT bins and therefore calculations, which can be simply performed in parallel. Furthermore, an equal number of sampling points increases a comparability of the received FFT data in the frequency domain.

Alternatively, the number $M(f_n)$ of sampling points of the first audio signal is frequency dependent and not equal for all FFT bins. The adaptive allows a focusing of the processing resources to those FFT bins, i.e. those frequencies, which are particularly important for the echo cancellation.

According to a second aspect, the invention relates to a hearing device, comprising an audio input interface, a speaker unit, a microphone unit, and the adaptive filter unit, and an audio output interface.

The audio input interface may be configured to receive an audio signal, to convert the audio signal into a first electric audio signal and to provide the first electric audio signal.

The speaker unit may be configured to receive the first electric audio signal and to convert the first electric signal into a perceivable audio output.

The microphone unit may be arranged and configured to convert an acoustic tone into a second electric audio signal and to provide the second electric audio signal.

The adaptive filter unit may bes configured to receive the first electric audio signal and the second electric audio signal, and may be further configured to filter the second electric audio signal based on the first electric audio signal and to determine a processed audio output signal.

The audio output interface may be configured to provide a device output signal, which is indicative of the processed audio output signal.

The hearing device has the same advantageous as the adaptive filter unit. In particular, the frequency dependent time delay processed by the adaptive feedback filter allows signal processing resources like a memory of the hearing device to be used in the most important parts of the frequency spectrum.

The hearing device according the second aspect of the invention will be described.

The hearing device further comprises a delay controller, arranged and configured to receive the first audio signal A(t) and the second audio signal B(t) and to control the processor by controlling the frequency dependent time delay of the delayed audio estimation data according to a length of an echo that is present in the second audio signal. This can be done by searching for similar signal characteristics in a respective frequency range of the first and second audio signal. The second audio signal B(t) may not be filtered by the adaptive filter unit, if the delay controller does not detect an echo in the present first audio signal, or if a detected echo has an intensity below a predetermined echo threshold. The delay controller of this variant leads to a fast processing of the hearing device.

In the hearing device, the audio input interface and the audio output interface are configured to wirelessly communicate with an external audio device. Therefore, the hearing device provides a high level of mobility of the hearing device.

The hearing device may be a headset, a headphone or a hearing aid.

According to a third aspect, the invention relates to a method for performing echo cancelling. The method comprises the following steps:

receiving a first electric audio signal, indicative of a first audio signal A(t);
  receiving a second electric audio signal, indicative of a second audio signal B(t);
  calculating and providing audio estimation data $X(f_n, A(t_1, \ldots, t_{M(fn)}))$ in the frequency domain by calculating a FFT transform of the first audio signal A(t), for frequencies $f_n = f_1, \ldots, f_N$, wherein N is a number of FFT bins, and with a number of sampling points $M(f_n)$ of the first audio signal A(t);
  calculating a transformed second audio signal $Y(f_n, B(t))$, formed by a transformation of the second audio signal B(t) into the frequency domain;
  calculating a filtered audio signal by subtracting delayed audio estimation data from the transformed second audio signal, wherein the delayed audio estimation data comprises a frequency dependent time delay compared to the transformed second audio signal; and
  calculating and providing a processed audio output signal by transforming the filtered audio signal into the time domain.

The method may further comprising a providing of a delay line structure that comprises a plurality of delay lines, in particular circular delay lines. Furthermore, the method includes the step of allocating the plurality of delay lines to each frequency $f_n$, respectively, wherein the delay lines vary in line length, which may be defined as a maximum number of values that can be stored in the respective delay line.

The filtered audio signal is determined by an adaptive algorithm for each frequency $f_n$. The adaptive algorithm depends on the signal strength of detected echoes. Furthermore. The adaptive algorithm depends on the signal strength of the second audio signal. In case of a high signal strength, soft echoes might not need to be filtered. As a result of this, the processing time of a respective processor can be reduced.

According to a fourth aspect, the invention relates to a computer program for controlling an operation of an adaptive filter unit, comprising program code means for causing a processor of the adaptive filter unit to carry out the method according to the third aspect of the invention.

The computer, which comprises the computer program for instance form an integral part of a headset, a headphone or of a hearing aid and can be implemented as a microcontroller or microprocessor.

BRIEF DESCRIPTION OF DRAWINGS

The aspects of the disclosure may be best understood from the following detailed description taken in conjunction with the accompanying figures. The figures are schematic and simplified for clarity, and they just show details to improve the understanding of the claims, while other details are left out. Throughout, the same reference numerals are used for identical or corresponding parts. The individual features of each aspect may each be combined with any or all features of the other aspects. These and other aspects, features and/or technical effect will be apparent from and elucidated with reference to the illustrations described hereinafter in which:

DETAILED DESCRIPTION

Figure 1:
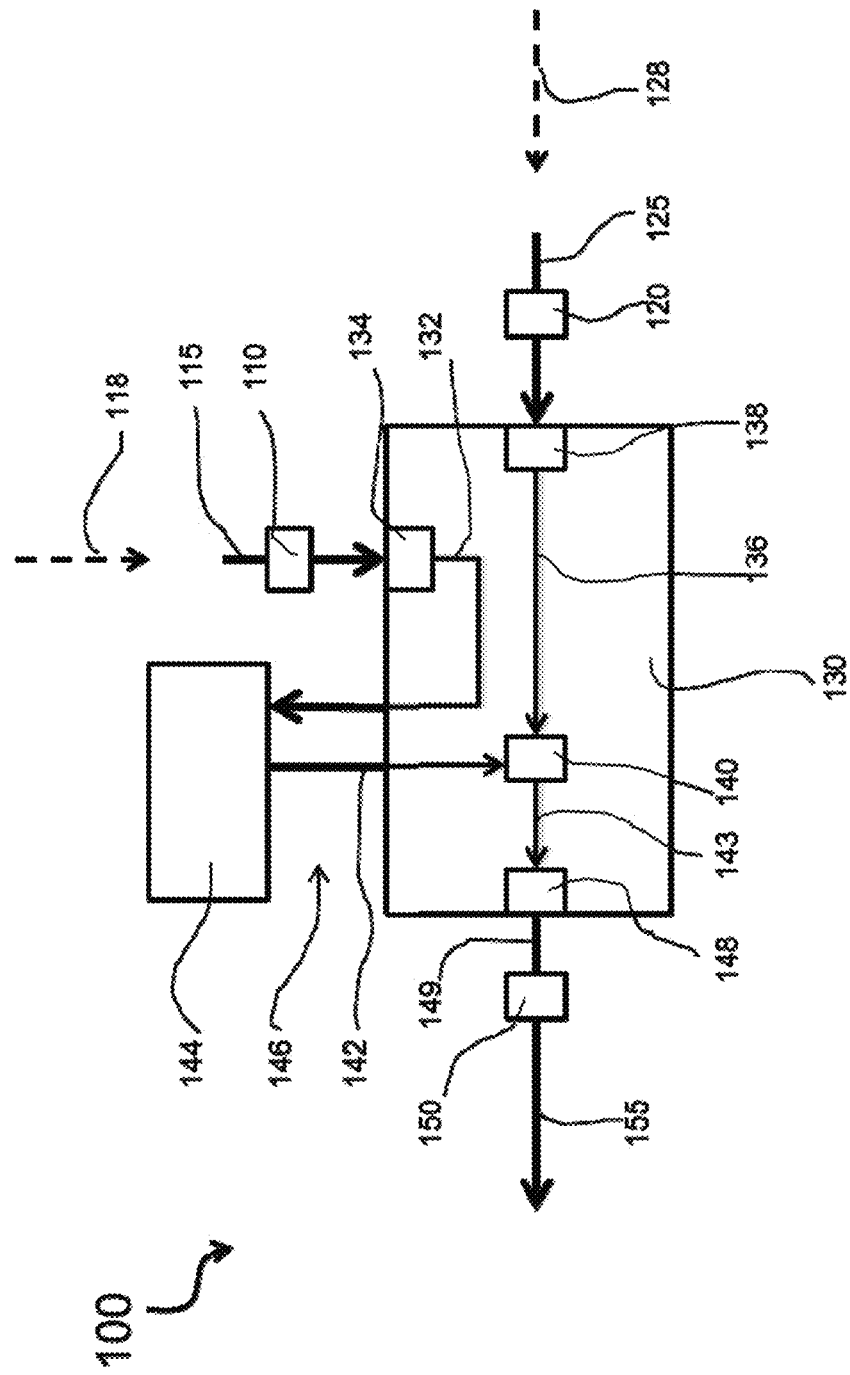
FIG. 1 illustrates an embodiment of an adaptive filter unit according to a first aspect of the invention.

The detailed description set forth below in connection with the appended drawings is intended as a description of various configurations. The detailed description includes specific details for the purpose of providing a thorough understanding of various concepts. However, it will be apparent to those skilled in the art that these concepts may be practiced without these specific details. Several aspects of the apparatus and methods are described by various blocks, functional units, modules, components, circuits, steps, processes, algorithms, etc. (collectively referred to as "elements"). Depending upon particular application, design constraints or other reasons, these elements may be implemented using electronic hardware, computer program, or any combination thereof.

The electronic hardware may include microprocessors, microcontrollers, digital signal processors (DSPs), field programmable gate arrays (FPGAs), programmable logic devices (PLDs), gated logic, discrete hardware circuits, and other suitable hardware configured to perform the various functionality described throughout this disclosure. Computer program shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

A hearing device may include a hearing aid that is adapted to improve or augment the hearing capability of a user by receiving an acoustic signal from a user's surroundings, generating a corresponding audio signal, possibly modifying the audio signal and providing the possibly modified audio signal as an audible signal to at least one of the user's ears. The "hearing device" may further refer to a device such as an earphone or a headset adapted to receive an audio signal electronically, possibly modifying the audio signal and providing the possibly modified audio signals as an audible signal to at least one of the user's ears. Such audible signals may be provided in the form of an acoustic signal radiated into the user's outer ear, or an acoustic signal transferred as mechanical vibrations to the user's inner ears through bone structure of the user's head and/or through parts of middle ear of the user or electric signals transferred directly or indirectly to cochlear nerve and/or to auditory cortex of the user.

The hearing device is adapted to be worn in any known way. This may include i) arranging a unit of the hearing device behind the ear with a tube leading air-borne acoustic signals or with a receiver/loudspeaker arranged close to or in the ear canal such as in a Behind-the-Ear type hearing aid or a Receiver-in-the Ear type hearing aid, and/or ii) arranging the hearing device entirely or partly in the pinna and/or in the ear canal of the user such as in a In-the-Ear type hearing aid or In-the-Canal/Completely-in-Canal type hearing aid, or iii) arranging a unit of the hearing device attached to a fixture implanted into the skull bone such as in Bone Anchored Hearing Aid or Cochlear Implant, or iv) arranging a unit of the hearing device as an entirely or partly implanted unit such as in Bone Anchored Hearing Aid or Cochlear Implant.

A "hearing system" refers to a system comprising one or two hearing devices, disclosed in present description, and a "binaural hearing system" refers to a system comprising two hearing devices where the devices are adapted to cooperatively provide audible signals to both of the user's ears. The hearing system or binaural hearing system may further include auxiliary device(s) that communicates with at least one hearing device, the auxiliary device affecting the operation of the hearing devices and/or benefitting from the functioning of the hearing devices. A wired or wireless communication link between the at least one hearing device and the auxiliary device is established that allows for exchanging information (e.g. control and status signals, possibly audio signals) between the at least one hearing device and the auxiliary device. Such auxiliary devices may include at least one of remote controls, remote microphones, audio gateway devices, mobile phones, public-address systems, car audio systems or music players or a combination thereof. The audio gateway is adapted to receive a multitude of audio signals such as from an entertainment device like a TV or a music player, a telephone apparatus like a mobile telephone or a computer, a PC. The audio gateway is further adapted to select and/or combine an appropriate one of the received audio signals (or combination of signals) for transmission to the at least one hearing device. The remote control is adapted to control functionality and operation of the at least one hearing devices. The function of the remote control may be implemented in a SmartPhone or other electronic device, the SmartPhone/electronic device possibly running an application that controls functionality of the at least one hearing device.

In general, a hearing device includes i) an input unit such as a microphone for receiving an acoustic signal from a user's surroundings and providing a corresponding input audio signal, and/or ii) a receiving unit for electronically receiving an input audio signal. The hearing device further includes a signal processing unit for processing the input audio signal and an output unit for providing an audible signal to the user in dependence on the processed audio signal.

The input unit may include multiple input microphones, e.g. for providing direction-dependent audio signal processing. Such directional microphone system is adapted to enhance a target acoustic source among a multitude of acoustic sources in the user's environment. In one aspect, the directional system is adapted to detect (such as adaptively detect) from which direction a particular part of the microphone signal originates. This may be achieved by using conventionally known methods. The signal processing unit may include amplifier that is adapted to apply a frequency dependent gain to the input audio signal. The signal processing unit may further be adapted to provide other relevant functionality such as compression, noise reduction, etc. The output unit may include an output transducer such as a loudspeaker/receiver for providing an air-borne acoustic signal transcutaneously or percutaneously to the skull bone or a vibrator for providing a structure-borne or liquid-borne acoustic signal. In some hearing devices, the output unit may include one or more output electrodes for providing the electric signals such as in a Cochlear Implant.

The detailed description set forth below in connection with the appended drawings is intended as a description of various configurations. The detailed description includes specific details for the purpose of providing a thorough understanding of various concepts. However, it will be apparent to those skilled in the art that these concepts may be practised without these specific details. Several aspects of the apparatus and methods are described by various blocks, functional units, modules, components, circuits, steps, processes, algorithms, etc. (collectively referred to as "elements"). Depending upon particular application, design constraints or other reasons, these elements may be implemented using electronic hardware, computer program, or any combination thereof.

The electronic hardware may include microprocessors, microcontrollers, digital signal processors (DSPs), field programmable gate arrays (FPGAs), programmable logic devices (PLDs), gated logic, discrete hardware circuits, and other suitable hardware configured to perform the various functionality described throughout this disclosure. Computer program shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Now referring to FIG. 1, which illustrates a first embodiment of the adaptive filter unit 100.

The adaptive filter unit 100 comprises a first filter input 110, a second filter input 120, a processor 130 and a filter output 150.

The first filter input 110 is configured to receive a first electric audio signal 115, indicative of a first audio signal 118 A(t).

The second filter input 120 is configured to receive a second electric audio signal 125, indicative of a second audio signal 128 B(t). In the shown embodiment, the first and second audio signal 118, 128 are provided digitally and therefore comprise an intensity information of the respective audio signal for a discrete number of times.

The processor 130 is connected to the first and second filter input 110, 120 and arranged and configured to receive the first and second electric audio signal 118, 128. After receiving the first audio signal 118, the processor is configured to calculate and provide audio estimation data 132 $X(f_n, A(t_1, \ldots, t_{M(fn)}))$ in the frequency domain by calculating a FFT transform of the first audio signal A(t), for frequencies $f_n=f_1, \ldots, f_N$, wherein N is a number of FFT bins, and with a number of sampling points $M(f_n)$ of the first audio signal A(t). This calculation is carried out by a first FFT unit 134. The processor 130 is further configured to calculate a transformed second audio signal 136 $Y(f_n, B(t))$, formed by a transformation of the second audio signal 128 B(t) into the frequency domain, in a second FFT unit 138. Delayed audio estimation data 142 is subtracted from the transformed second audio signal 136 by the processor 130 in a subtracting unit 140. Thereby, the subtraction unit 140 calculates a filtered audio signal 143. The delayed audio estimation data 142 is provided by a memory unit 144 of the adaptive filter unit 100, which is arranged to provide a data exchange 146 with the processor 130. The data exchange further comprises a providing of the audio estimation data 132 to the memory unit 144. The delayed audio estimation data 142 comprises a frequency dependent time delay compared to the transformed second audio signal 136. A reverse FFT unit 148 of the processor 130 is further configured to calculate a processed audio output signal 149 by transforming the filtered audio signal 143 into the time domain. The detailed calculation schemes of the first, the second and the reverse FFT units 134, 138, 148 are provided as standard FFT schemes, which are well known in the art.

The filter output 150 is configured to provide the processed audio output signal 155.

The memory unit 144 of this embodiment comprises a plurality of circular delay lines allocated to each frequency $f_n$, respectively, wherein the circular delay lines vary in line length, which is defined as a maximum number of values that can be stored in the respective circular delay line. The structure of the circular delay lines and of the line lengths of this embodiment are illustrated and discussed in the course of FIG. 2.

For reasons of simplicity, it is not illustrated that the memory unit 144 of this embodiment further comprises a base address register allocating each circular delay line to a base address, and further comprises separate bookkeeping buffers, which are configured to store the line length and the base address of each circular delay line. This allows the memory of the memory unit 144 to be formed as a block of memory that stores the base address and the line length of each delay line wherever memory is free for storing data. The not shown block of memory has a block size that equals the sum of all delay lines in order to store all values that are stored within the circular delay lines at each point in time.

Figure 2:
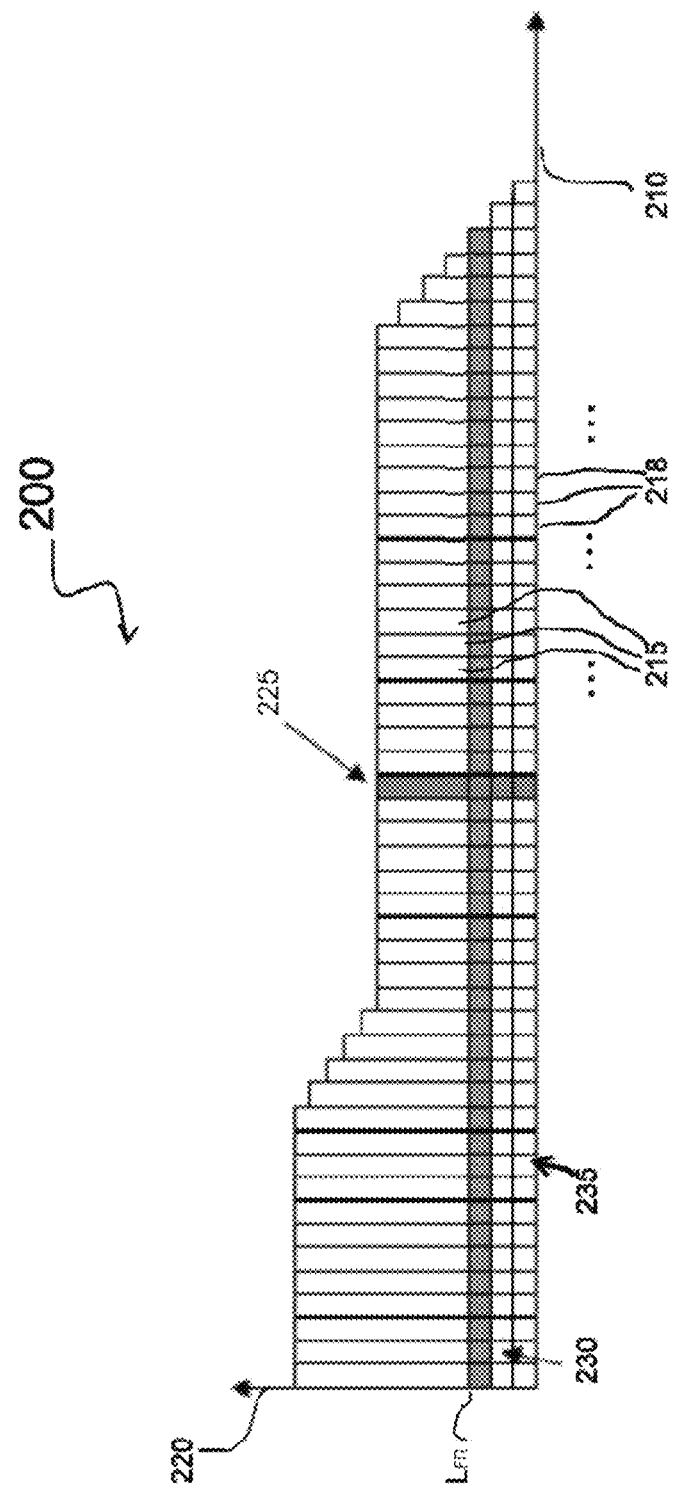
FIG. 2 illustrates a delay line structure of the embodiment of the adaptive filter unit according to the first aspect of the invention.

FIG. 2 illustrates a delay line structure 200 of the embodiment of the adaptive filter unit 100 shown in FIG. 1.

The axis of abscissas 210 shows the FFT bins 215 in the frequency domain. The frequencies $f_n=f_1, \ldots, f_N$, for which the FFT transform is calculated by the processor 130, are the respective center frequencies 218 of each FFT bin 215. All FFT bins 215 of this embodiment have the same size meaning that they all cover the same frequency range.

The axis of ordinates 220 shows the line length of each delay line 225 allocated to a respective FFT bin 215, i.e. to a center frequency 218. The delay lines 225 are circular delay lines, so that each value stored in the delay line is overwritten after a predefined period of time, which depends on the line length. Furthermore, the circular delay lines of this embodiment vary in line length, as illustrated in FIG. 2.

A single grayscale delay line frame 230 is shown, which comprises the audio estimation data $X(f_n, A(t'_1, \ldots, t'_{M(fn)}))$ for those FFT bins 215, which have a line length of at least $L_{FR}$. The points in time $t'_1, \ldots, t'_{M(fn)}$ are thus before the time $t_1$ of the most recent delay line frame 235. The delay line frames that have a line length of more than $L_{FR}$ comprise audio estimation data that has been recorded before the times $t'_1, \ldots t'_{M(fn)}$.

Therefore, FIG. 2 illustrates that the circular delay lines 225 with the largest line length are allocated to the FFT bins 215 with small center frequencies 218. Thus, the adaptive filter unit 100 allows the filtering of long echoes in the low frequency area by subtracting the respective strongly delayed audio estimation data from the transformed second audio signal 136.

In order to avoid wasting memory the line lengths may be limited to powers of two.

Figure 3:
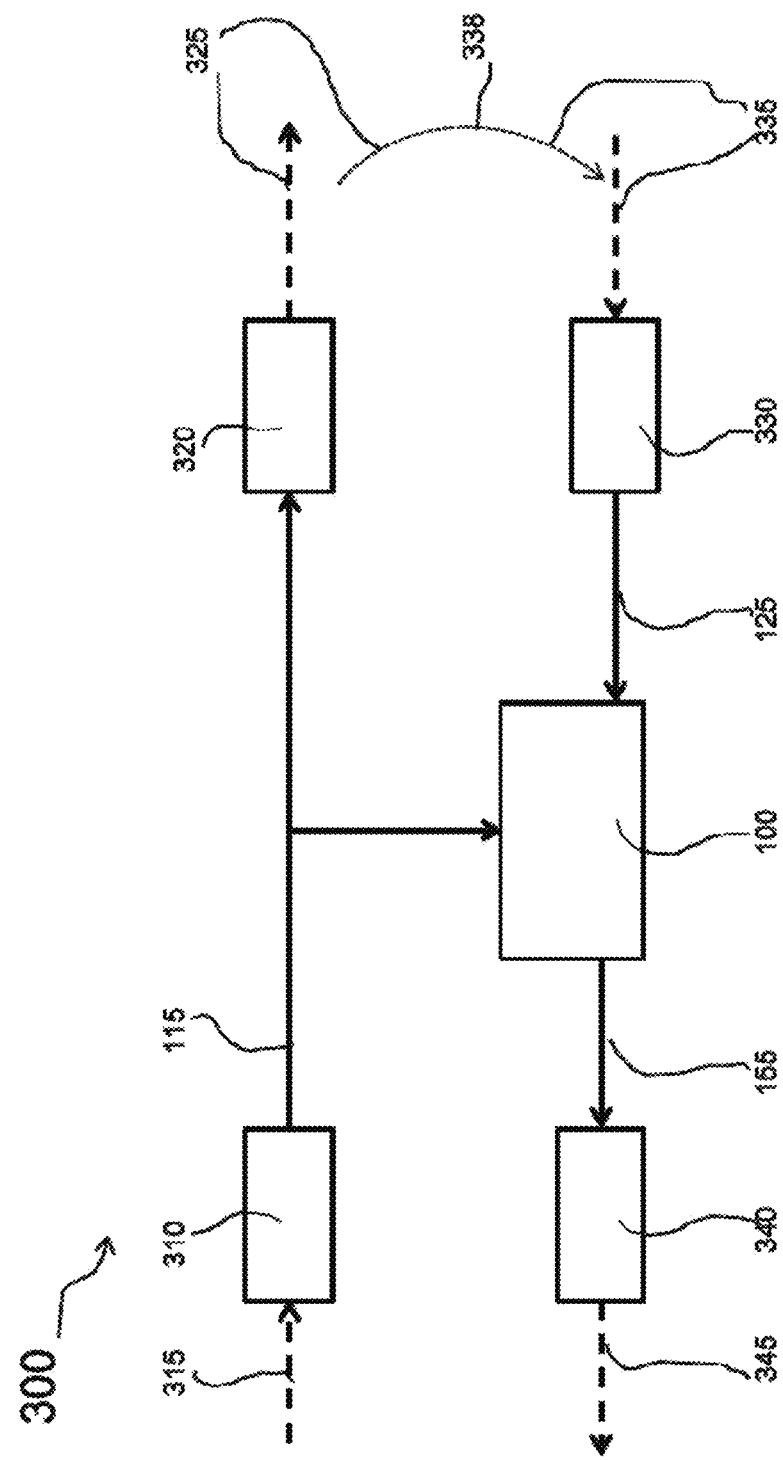
FIG. 3 illustrates an embodiment of a hearing device according to a second aspect of the invention.

FIG. 3 illustrates an embodiment of a hearing device 300.

The hearing device 300 comprises an audio input interface 310, a speaker unit 320, a microphone unit 330, the adaptive filter unit 100 according to an embodiment of the first aspect of the invention, and an audio output interface 340.

The audio input interface 310 is configured to receive an audio signal 315, to convert the audio signal 315 into the first electric audio signal 115 and to provide the first electric audio signal 115.

The speaker unit 320 is configured to receive the first electric audio signal 115 and to convert the first electric signal 115 into a perceivable audio output 325.

The microphone unit 330 is arranged and configured to convert an acoustic tone 335 into the second electric audio signal 125 and to provide the second electric audio signal 125. The acoustic tone 335 typically comprises at least parts of the audio output 325, which have been reflected by the environment of the hearing device 300 and thus form an echo 338.

The adaptive filter unit 100 is configured to receive the first electric audio signal 115 and the second electric audio signal 125, and is further configured to filter the second electric audio signal 125 based on the first electric audio signal 115 and to determine a processed audio output signal 155.

The audio output interface 340 is configured to provide a device output signal 345, indicative of the processed audio output signal 155.

The audio input interface 310 and the audio output interface 340 of the embodiment shown in FIG. 3 are configured to wirelessly communicate with an external audio device (not shown). Both interfaces 310, 340 thus comprise an antenna system (not shown) for receiving and/or transmitting wireless signals 315, 345. The external audio device is in this embodiment a mobile phone, a notebook, a headphone, a headset or a hearing aid of a further user, who communicates with the user of the hearing device 300.

The illustrated hearing device 300 is a headset. However, in embodiments not shown, the hearing device is a headphone, a hearing aid or another device with at least one microphone and at least one speaker for outputting and receiving acoustics tones.

In an embodiment not shown, the hearing device further comprises a delay controller, arranged and configured to receive the first audio signal A(t) and the second audio signal B(t) and to control the processor by controlling the frequency dependent time delay of the delayed audio estimation data according to a length of an echo that is present in the second audio signal. The delay controller of this embodiment is arranged within a signal path between the microphone unit and the adaptive filter unit and directly connected to the processor of the adaptive filter unit. Upon detection of similar signal characteristics in a respective frequency range of the first and second audio signal, i.e. of an echo, the delay controller is configured to activate the filtering of the second audio signal by the adaptive filter unit. In further embodiments not shown, the delay controller is further configured to determine, whether the detected echo has an intensity below or above a predetermined echo threshold and to activate the filtering only if the intensity of the echo is above the echo threshold.

Figure 4:
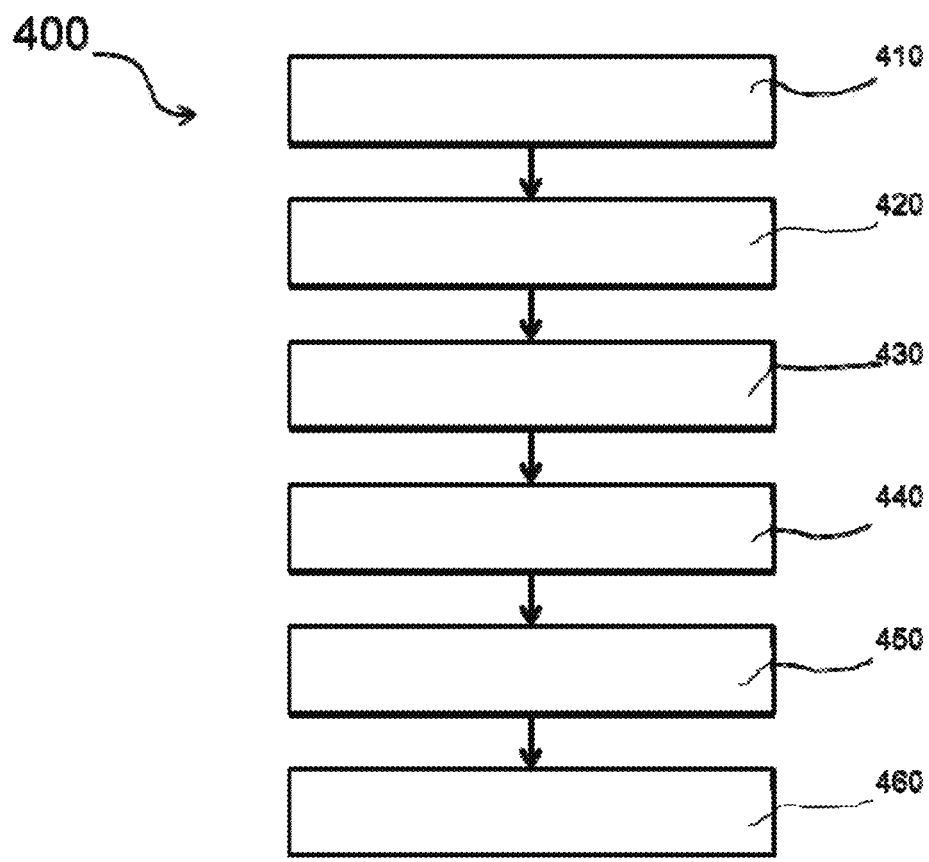
FIG. 4 illustrates an embodiment of a method for performing echo cancelling according to a third aspect of the invention.

FIG. 4 illustrates an embodiment of a method 400 for performing echo cancelling. The method 400 comprises steps 410, 420, 430, 440, 450, 460 that are given in the following.

The first step 410 is formed by a reception of a first electric audio signal, which is indicative of a first audio signal A(t).

In the further step 420, a second electric audio signal, which is indicative of a second audio signal B(t), is received.

The next step 430 includes a calculation and a provision of an audio estimation data $X(f_n, A(t_1, \ldots, t_{M(fn)}))$ in the frequency domain by calculating a FFT transform of the first audio signal A(t), for frequencies $f_n=f_1, \ldots, f_N$, wherein N is a number of FFT bins, and with a number of sampling points $M(f_n)$ of the first audio signal A(t).

Afterwards, a transformed second audio signal $Y(f_n, B(t))$, formed by a transformation of the second audio signal B(t) into the frequency domain, is calculated in the step 440.

In another step 450, a filtered audio signal is calculated by subtracting delayed audio estimation data from the transformed second audio signal, wherein the delayed audio estimation data comprises a frequency dependent time delay compared to the transformed second audio signal.

The last step 460 of the method 400 is formed by calculating and providing a processed audio output signal by transforming the filtered audio signal into the time domain.

The illustrated order of the steps 410, 420, 430, 440, 450, 460 in this embodiment forms the preferred order of the method according to the third aspect of the invention.

As used, the singular forms "a," "an," and "the" are intended to include the plural forms as well (i.e. to have the meaning "at least one"), unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will also be understood that when an element is referred to as being "connected" or "coupled" to another element, it can be directly connected or coupled to the other element but an intervening elements may also be present, unless expressly stated otherwise. Furthermore, "connected" or "coupled" as used herein may include wirelessly connected or coupled. As used herein, the term "and/or" includes any and all combinations of one or more of the associated listed items. The steps of any disclosed method is not limited to the exact order stated herein, unless expressly stated otherwise.

It should be appreciated that reference throughout this specification to "one embodiment" or "an embodiment" or "an aspect" or features included as "may" means that a particular feature, structure or characteristic described in connection with the embodiment is included in at least one embodiment of the disclosure. Furthermore, the particular features, structures or characteristics may be combined as suitable in one or more embodiments of the disclosure. The previous description is provided to enable any person skilled in the art to practice the various aspects described herein. Various modifications to these aspects will be readily apparent to those skilled in the art, and the generic principles defined herein may be applied to other aspects.

The claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more.

REFERENCE NUMBER LIST 100 adaptive filter unit
110 first filter input
115 first electric audio signal
118 first audio signal
120 second filter input
125 second electric audio signal
128 second audio signal
130 processor
132 audio estimation data
134 first FFT unit
136 transformed second audio signal
138 second FFT unit
140 subtracting unit
142 delayed audio estimation data
143 filtered audio signal
144 memory unit
146 data exchange
148 reverse FFT unit
149 audio output signal
150 filter output
155 processed audio output signal
200 delay line structure
210 axis of abscissas
215 FFT bin
218 center frequency
220 axis of ordinates
225 delay line
230 delay line frame
235 most recent delay line frame
300 hearing device
310 audio input interface
315 audio signal
320 speaker unit
325 audio output
330 microphone unit
335 acoustic tone
338 echo
340 audio output interface
345 device output signal
400 method
410, 420, 430 440, 450, 460 steps of the method

The invention claimed is:

1. An adaptive filter unit, in particular for being used as an echo canceller, comprising:
a first filter input, configured to receive a first electric audio signal, indicative of a first audio signal A(t);
a second filter input, configured to receive a second electric audio signal, indicative of a second audio signal B(t);

a processor, arranged and configured to
receive the first electric audio signal and the second electric audio signal;
calculate and provide audio estimation data $X(f_n, A(t_1, \ldots, t_{M(fn)}))$ in a frequency domain by calculating a Fast Fourier Transform of the first audio signal $A(t)$, for frequencies $f_n = f_1, \ldots, f_N$, wherein N is a number of FFT bins, and with a number of sampling points $M(f_n)$ of the first audio signal $A(t)$;
calculate a transformed second audio signal $Y(f_n, B(t))$, formed by a transformation of the second audio signal $B(t)$ into the frequency domain;
calculate a filtered audio signal by subtracting delayed audio estimation data from the transformed second audio signal, wherein the delayed audio estimation data is provided by a memory unit of the adaptive filter unit, which is arranged to provide a data exchange with the processor, and wherein the delayed audio estimation data comprises a frequency dependent time delay compared to the transformed second audio signal;
calculate a processed audio output signal by transforming the filtered audio signal into the time domain; and
a filter output, configured to provide the processed audio output signal.

2. The adaptive filter according to claim 1, wherein the processor comprises a multidelay filter structure.

3. The adaptive filter unit according to claim 1, wherein the memory unit comprises a delay line structure comprising at least one delay line, which contains at least the audio estimation data $X(f_n, A(t'_1, \ldots, t'_{M(fn)}))$ for points in time $t'_1, \ldots, t'_{M(fn)}$ being before the time $t_1$.

4. The adaptive filter unit according to claim 3, wherein the memory unit comprises a plurality of circular delay lines allocated to each frequency $f_n$, respectively, wherein the circular delay lines vary in line length, which is defined as a maximum number of values that can be stored in the respective circular delay line.

5. The adaptive filter unit according to claim 1, wherein the data exchange between the processor and the memory unit comprises an allocation of a value of the audio estimation data $X(f_n, A(t_1, \ldots, t_{M(fn)}))$ for each frequency $f_n$ to a memory address of a memory structure of the memory unit.

6. The adaptive filter unit according to claim 3, wherein each delay line comprises a line length that is limited to powers of two.

7. The adaptive filter unit according to claim 5, wherein the memory unit comprises a base address register allocating each circular delay line to a base address, and further comprises at least one bookkeeping buffer, configured to store the line length and the base address of each circular delay line.

8. The adaptive filter unit according to claim 1, wherein the number $M(f_n)$ of sampling points of the first audio signal is equal for all FFT bins.

9. A hearing device, comprising
an audio input interface, configured to receive an audio signal, to convert the audio signal into a first electric audio signal and to provide the first electric audio signal;
a speaker unit, configured to receive the first electric audio signal and to convert the first electric signal into a perceivable audio output;
a microphone unit, arranged and configured to convert an acoustic tone into a second electric audio signal and to provide the second electric audio signal;
an adaptive filter unit according to claim 1, configured to receive the first electric audio signal and the second electric audio signal, and which is further configured to filter the second electric audio signal based on the first electric audio signal and to determine a processed audio output signal; and
an audio output interface, configured to provide a device output signal, indicative of the processed audio output signal.

10. The hearing device according to claim 9, further comprising a delay controller, arranged and configured to receive the first audio signal $A(t)$ and the second audio signal $B(t)$ and to control the processor by controlling the frequency dependent time delay of the delayed audio estimation data according to a length of an echo that is present in the second audio signal.

11. The hearing device according to claim 9, wherein the audio input interface and the audio output interface are configured to wirelessly communicate with an external audio device.

12. The hearing device according to claim 9, wherein the hearing device is a headset, a headphone or a hearing aid.

13. The adaptive filter unit according to claim 2, wherein the memory unit comprises a delay line structure comprising at least one delay line, which contains at least the audio estimation data $X(f_n, A(t'_1, \ldots, t'_{M(fn)}))$ for points in time $t'_1, \ldots, t'_{M(fn)}$ being before the time $t_1$.

14. The adaptive filter unit according to claim 2, wherein the data exchange between the processor and the memory unit comprises an allocation of a value of the audio estimation data $X(f_n, A(t_1, \ldots, t_{M(fn)}))$ for each frequency $f_n$ to a memory address of a memory structure of the memory unit.

15. The adaptive filter unit according to claim 3, wherein the data exchange between the processor and the memory unit comprises an allocation of a value of the audio estimation data $X(f_n, A(t_1, \ldots, t_{M(fn)}))$ for each frequency $f_n$ to a memory address of a memory structure of the memory unit.

16. The adaptive filter unit according to claim 4, wherein the data exchange between the processor and the memory unit comprises an allocation of a value of the audio estimation data $X(f_n, A(t_1, \ldots, t_{M(fn)}))$ for each frequency $f_n$ to a memory address of a memory structure of the memory unit.

17. A method for performing echo cancelling, comprising the steps of:
receiving a first electric audio signal, indicative of a first audio signal $A(t)$;
receiving a second electric audio signal, indicative of a second audio signal $B(t)$;
calculating and providing audio estimation data $X(f_n, A(t_1, \ldots, t_{M(fn)}))$ in a frequency domain by calculating a Fast Fourier Transform of the first audio signal $A(t)$, for frequencies $f_n = f_1, \ldots, f_N$, wherein N is a number of FFT bins, and with a number of sampling points $M(f_n)$ of the first audio signal $A(t)$;
calculating a transformed second audio signal $Y(f_n, B(t))$, formed by a transformation of the second audio signal $B(t)$ into the frequency domain;
calculating a filtered audio signal by subtracting delayed audio estimation data from the transformed second audio signal, wherein the delayed audio estimation data comprises a frequency dependent time delay compared to the transformed second audio signal; and
calculating and providing a processed audio output signal by transforming the filtered audio signal into the time domain.

18. The method according to claim 17, further comprising
providing a delay line structure comprising a plurality of
delay lines, in particular circular delay lines;
allocating the plurality of delay lines to each frequency $f_n$, respectively, wherein the delay lines vary in line length, which is defined as a maximum number of values that can be stored in the respective delay line.

19. The method according to claim 17, wherein the filtered audio signal is determined by an adaptive algorithm for each frequency $f_n$.

20. A non-transitory computer-readable medium storing a program for controlling an operation of an adaptive filter unit, comprising program code means for causing a processor of the adaptive filter unit to carry out a method according to claim 17.

\* \* \* \* \*